US006995443B2

(12) United States Patent
Geusic et al.

(10) Patent No.: US 6,995,443 B2
(45) Date of Patent: Feb. 7, 2006

(54) INTEGRATED CIRCUITS USING OPTICAL FIBER INTERCONNECTS FORMED THROUGH A SEMICONDUCTOR WAFER

(75) Inventors: Joseph E. Geusic, Berkeley Heights, NJ (US); Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/772,606

(22) Filed: Feb. 5, 2004

(65) Prior Publication Data

US 2004/0156578 A1    Aug. 12, 2004

Related U.S. Application Data

(60) Division of application No. 09/650,569, filed on Aug. 30, 2000, now Pat. No. 6,723,577, which is a continuation of application No. 09/031,975, filed on Feb. 26, 1998, now Pat. No. 6,150,188.

(51) Int. Cl.
   *H01L 31/0232* (2006.01)
(52) U.S. Cl. .......................... 257/432; 257/82; 257/83; 257/84; 257/98; 257/116; 438/667
(58) Field of Classification Search .............. 257/82, 257/83, 84, 98, 116, 432, E21.127; 438/667
See application file for complete search history.

(56) References Cited

U.S. PATENT DOCUMENTS

| 3,968,564 | A |   | 7/1976 | Springthorpe | 29/580 |
|---|---|---|---|---|---|
| 4,452,508 | A | * | 6/1984 | Beales et al. | 385/124 |
| 4,734,384 | A |   | 3/1988 | Tsuchiya | 437/52 |
| 4,744,623 | A |   | 5/1988 | Prucnal et al. | 350/96.2 |
| 4,920,070 | A |   | 4/1990 | Mukai | 437/173 |
| 4,970,578 | A |   | 11/1990 | Tong et al. | 357/81 |
| 5,039,189 | A | * | 8/1991 | Lytel et al. | 385/2 |
| 5,128,831 | A |   | 7/1992 | Fox, III et al. | 361/396 |
| 5,200,631 | A |   | 4/1993 | Austin et al. |  |
| 5,221,633 | A |   | 6/1993 | Holm et al. | 437/51 |
| 5,312,765 | A |   | 5/1994 | Kanber | 437/22 |
| 5,352,998 | A |   | 10/1994 | Tanino | 333/247 |
| 5,362,976 | A |   | 11/1994 | Suzuki | 257/81 |
| 5,409,563 | A |   | 4/1995 | Cathey | 156/643 |
| 5,416,872 | A |   | 5/1995 | Sizer, II et al. | 385/92 |

(Continued)

FOREIGN PATENT DOCUMENTS

JP    56-055067    5/1981

(Continued)

OTHER PUBLICATIONS

Forbes, L. , et al., "Resonant Forward-Biased Guard-Ring Diodes for Suppression of Substrate Noise in Mixed-Mode CMOS Circuits", *Electronics Letters*, 31, (Apr. 1995), 720-721.

(Continued)

*Primary Examiner*—George Fourson
*Assistant Examiner*—Julio J. Maldonado
(74) *Attorney, Agent, or Firm*—Schwegman, Lundberg, Woessner & Kluth, P.A.

(57) ABSTRACT

An integrated circuit with a number of optical fibers that are formed in high aspect ratio holes. The high aspect ratio holes extend through a semiconductor wafer. The optical fibers include a cladding layer and a core formed in the high aspect ratio hole. These optical fibers are used to transmit signals between functional circuits on the semiconductor wafer and functional circuits on the back of the wafer or beneath the wafer.

47 Claims, 4 Drawing Sheets

U.S. PATENT DOCUMENTS

| | | | |
|---|---|---|---|
| 5,431,775 A * | 7/1995 | Prince | 216/24 |
| 5,483,614 A * | 1/1996 | Bruck et al. | 385/142 |
| 5,489,554 A | 2/1996 | Gates | 437/208 |
| 5,532,506 A | 7/1996 | Tserng | 257/276 |
| 5,587,119 A | 12/1996 | White | 264/104 |
| 5,604,835 A | 2/1997 | Nakamura et al. | 385/129 |
| 5,618,752 A * | 4/1997 | Gaul | 438/626 |
| 5,641,545 A | 6/1997 | Sandhu | 427/573 |
| 5,652,811 A | 7/1997 | Cook et al. | |
| 5,656,548 A | 8/1997 | Zavracky et al. | 438/23 |
| 5,682,062 A | 10/1997 | Gaul | 257/686 |
| 5,729,038 A | 3/1998 | Young et al. | 257/460 |
| 5,739,067 A | 4/1998 | DeBusk et al. | 438/618 |
| 5,742,100 A | 4/1998 | Schroeder et al. | 257/778 |
| 5,760,478 A | 6/1998 | Rozso et al. | 257/777 |
| 5,767,001 A | 6/1998 | Bertagnolli et al. | 438/455 |
| 5,796,714 A | 8/1998 | Chino et al. | 372/50 |
| 5,798,297 A | 8/1998 | Winnerl et al. | 438/622 |
| 5,834,849 A | 11/1998 | Lane | 257/786 |
| 5,844,289 A | 12/1998 | Teranishi et al. | 257/432 |
| 5,848,214 A | 12/1998 | Haas et al. | 385/120 |
| 5,858,814 A | 1/1999 | Goossen et al. | 438/107 |
| 5,858,877 A | 1/1999 | Dennison et al. | 438/700 |
| 5,897,333 A | 4/1999 | Goossen et al. | 438/455 |
| 5,900,674 A | 5/1999 | Wojnarowski et al. | 257/774 |
| 5,901,050 A | 5/1999 | Imai | 361/820 |
| 5,902,118 A | 5/1999 | Hubner | 438/106 |
| 5,903,045 A | 5/1999 | Bertin et al. | 257/621 |
| 5,915,167 A | 6/1999 | Leedy | 438/108 |
| 5,952,665 A | 9/1999 | Bhargava | 250/483.1 |
| 5,963,088 A | 10/1999 | Czarnul et al. | 330/69 |
| 6,087,899 A * | 7/2000 | Kubota | 330/253 |
| 6,090,636 A | 7/2000 | Geusic et al. | 438/31 |
| 6,122,187 A | 9/2000 | Ahn et al. | 365/63 |
| 6,143,616 A | 11/2000 | Geusic et al. | 438/389 |
| 6,150,188 A | 11/2000 | Geusic et al. | 438/31 |
| 6,181,864 B1 | 1/2001 | Jang et al. | 385/137 |
| 6,187,677 B1 | 2/2001 | Ahn | 438/667 |
| 6,198,168 B1 | 3/2001 | Geusic et al. | 257/774 |
| 6,281,042 B1 | 8/2001 | Ahn et al. | 438/108 |

FOREIGN PATENT DOCUMENTS

| | | |
|---|---|---|
| JP | 03-013907 | 1/1991 |
| JP | 04-263462 | 9/1992 |
| JP | 05-145060 | 6/1993 |
| WO | WO-91/11833 | 8/1991 |
| WO | WO-94/05039 | 3/1994 |

OTHER PUBLICATIONS

Foster, R., et al., "High Rate Low-Temperature Selective Tungsten", In: Tungsten and Other Refractory Metals for VLSI Applications III, V.A. Wells, ed., Materials Res. Soc., Pittsburgh, PA,(1988),69-72.

Gong, S. , et al., "Techniques for Reducing Switching Noise in High Speed Digital System", Proceedings of the 8th Annual IEEE International ASIC Conference and Exhibit, Austin, TX,(1995),21-24.

Heavens, O. , Optical Properties of Thin Solid Films, Dover Pubs. Inc., New York,(1965),155-206.

Horie, H. , et al., "Novel High Aspect Ration Aluminum Plug for Logic/DRAM LSI's Using Polysilicon-Aluminum Substitute", Technical Digest: IEEE International Electron Devices Meeting, San Francisco , CA,(1996),946-948.

Kim, Y. S., et al., "A Study on Pyrolysis DMEAA for Selective Deposition of Aluminum", In: Advanced Metallization and Interconnect Systems for ULSI Applications in 1995, R.C. Ellwanger, et al., (eds.), Materials Research Society, Pittsburgh, PA,(1996),675-680.

Klaus, et al., "Atomic Layer Controlled Growth of SiO2 Films Using Binary Reaction Sequence Chemistry", Applied Physics Lett. 70(9), (Mar. 3, 1997),1092-94.

Lehmann, et al. "A Novel Capacitor Technology Based on Porous Silicon", Thin Solid Films 276, Elsevier Science, (1996),138-42.

Lehmann, et al., "The Physics of Macropore Formation in Low Doped n-Type Silicon", Journal of the Electrochemcial Society, 140 (10), (Oct. 1993),2836-2843.

Masu, K. , et al., "Multilevel Metallization Based of Al CVD", 1996 IEEE Symposium on VLSI Technology, Digest of Technical Papers, Honolulu, HI,(Jun. 11-13, 1996),44-45.

McCredie, B. D., et al., "Modeling, Measurement, and Simulation of Simultaneous Switching Noise", IEEE Transactions on Components, Packaging, and Manufacturing Technology—Part B, 19, (Aug. 1996),461-472.

Muller, K. , et al., "Trench Storage Node Technology for Gigabit DRAM Generations", Digest IEEE International Electron Devices Meeting, San Francisco, CA,(Dec. 1996), 507-510.

Ohba, T., et al., "Evaluation on Selective Deposition of CVD W Films by Measurement of Surface Temperature", In: Tungsten and Other Refractory Metals for VLSI Applications II, Materials Research Society, Pittsburgh, PA,(1987), 59-66.

Ohba, T. , et al., "Selective Chemical Vapor Deposition of Tungsten Using Silane and Polysilane Reductions", In: Tungsten and Other Refractory Metals for VLSI Applications IV, Materials Research Society, Pittsburgh, PA,(1989), 17-25

Ott, A.W., et al., "Al3O3 Thin Film Growth on Si(100) Using Binary Reaction Sequence Chemistry", Thin Solid Films, vol. 292, (1997),135-44.

Ramo, S. , et al., Field and Waves in Communication Electronics, Third Edition, John Wiley & Sons, Inc.,(1994), pp. 428-433.

Senthinathan, R. , et al., "Reference Plane Parasitics Modeling and Their Contribution to the Power and Ground Path "Effective" Inductance as Seen by the Output Drivers", IEEE Transactions on Microwave Theory and Techniques, 42, (Sep. 1994),1765-1773.

Stanisic, B. R., et al., "Addressing Noise Decoupling in Mixed-Signal IC's: Power Distribution Design and Cell Customization", IEEE Journal of Solid-State Circuits, 30, (Mar. 1995),321-326.

Su, D. K., et al., "Experimental Results and Modeling Techniques for Substrate Noise in Mixed Signal Integrated Circuits", IEEE Journal of Solid State Circuits, vol. SC-28, (1993),420-30.

Suntola, T. , "Atomic Layer Epitaxy", Handbook of Crystal Growth, 3; Thin Films of Epitaxy, Part B: Growth Mechanics and Dynamics, Amsterdam,(1994),602-663.

Sze, S. M., VLSI Technology, 2nd Edition, Mc Graw-Hill, NY, (1988),90.

Vittal, A. , et al., "Clock Skew Optimization for Ground Bounce Control", 1996 IEEE/ACM International Conference on Computer-Aided Design, Digest of Technical Papers, San Jose, CA,(Nov. 10-14, 1996),395-399.

* cited by examiner

INTEGRATED CIRCUITS USING OPTICAL FIBER INTERCONNECTS FORMED THROUGH A SEMICONDUCTOR WAFER

This application is a Divisional of U.S. application Ser. No. 09/650,569, filed Aug. 30, 2000, now U.S. Pat. No. 6,723,577, which is a Continuation of U.S. application, Ser. No. 09/031,975, filed on Feb. 26, 1998, now U.S. Pat. No. 6,150,188, both of which are incorporated herein by reference.

TECHNICAL FIELD OF THE INVENTION

The present invention relates generally to the field of integrated circuits and, in particular, to integrated circuits using optical fiber interconnects formed through a semiconductor wafer and methods for forming same.

BACKGROUND OF THE INVENTION

Electrical systems typically use a number of integrated circuits that are mounted on a printed circuit board. The individual integrated circuits of the system are typically fabricated on different wafers. Each wafer is tested and separated into individual dies or chips. Individual chips are then packaged as individual integrated circuits. Each integrated circuit includes a number of leads that extend from the packaging of the circuit. The leads of the various integrated circuits, are interconnected to allow information and control signals to be passed between the integrated circuits such that the system performs a desired function. For example, a personal computer includes a wide variety of integrated circuits, e.g., a microprocessor and memory chips, that are interconnected on one or more printed circuit boards in the computer.

While printed circuit boards are useful for bringing together separately fabricated and assembled integrated circuits, the use of printed circuit boards creates some problems which are not so easily overcome. For example, printed circuit boards consume a large amount of physical space compared to the circuitry of the integrated circuits which are mounted to them. It is desirable to reduce the amount of physical space required by such printed circuit boards. Further, assuring the electrical integrity of interconnections between integrated circuits mounted on a printed circuit board is a challenge. Moreover, in certain applications, it is desirable to reduce the physical length of electrical interconnections between devices because of concerns with signal loss or dissipation and interference with and by other integrated circuitry devices.

A continuing challenge in the semiconductor industry is to find new, innovative, and efficient ways of forming electrical connections with and between circuit devices which are fabricated on the same and on different wafers or dies. Relatedly, continuing challenges are posed to find and/or improve upon the packaging techniques utilized to package integrated circuitry devices. As device dimensions continue to shrink, these challenges become even more important.

For reasons stated above, and for other reasons stated below which will become apparent to those skilled in the art upon reading and understanding the present specification, there is a need in the art for an improved technique for interconnecting individual integrated circuits in an electronic system.

SUMMARY OF THE INVENTION

The above mentioned problems with integrated circuits and other problems are addressed by the present invention and will be understood by reading and studying the following specification. Integrated circuits are described which use optical fibers that extend through the thickness of a semiconductor substrate or wafer so as to allow communication between integrated circuits formed on opposite sides of a single wafer, on opposite sides of two wafers that are bonded together, formed on wafers in a stack that are bonded together, or other appropriate configuration of wafers.

In one embodiment, a method for interconnecting first and second integrated circuits is provided. The first integrated circuit is formed on a working surface of a first semiconductor substrate. At least one high aspect ratio hole is formed through the first semiconductor substrate. An optical fiber with a cladding layer and a core is formed in the at least one high aspect ratio hole. The optical fiber having first and second ends. The first integrated circuit is coupled to the second integrated circuit through the optical fiber. In one embodiment, the second integrated circuit is formed on a second surface of the first semiconductor substrate, opposite the working surface of the first semiconductor substrate. In another embodiment, the second integrated circuit is formed on a working surface of a second semiconductor substrate. The second semiconductor substrate is bonded to the first semiconductor substrate such that the first and second integrated circuits are coupled together through the optical fiber in the first semiconductor substrate. In another embodiment, the surfaces of the first and second semiconductor substrates that are bonded together are located on sides of the first and second semiconductor substrates that are opposite the working surfaces of the first and second semiconductor substrates, respectively.

In another embodiment, an electronic system is provided. The electronic system includes at least one semiconductor wafer. A number of integrated circuits are also provided. At least one integrated circuit is formed on the at least one semiconductor wafer. The at least one semiconductor wafer includes at least one optical fiber formed in a high aspect ratio hole that extends through the thickness of the at least one semiconductor wafer. At least one optical transmitter and at least one optical receiver are associated with the at least one optical fiber. The optical transmitter and optical receiver transmit optical signals between selected integrated circuits of the electronic system over the optical fiber.

In another embodiment, an integrated circuit is provided. The integrated circuit includes a functional circuit formed on a wafer. A number of optical fibers are formed in high aspect ratio holes that extend through the wafer. The optical fibers include a cladding layer and a center core that are formed from materials with different indices of refraction.

In another embodiment, a method for forming an integrated circuit in a semiconductor wafer with an optical fiber that extends through the semiconductor wafer is provided. The method includes forming a functional circuit in a first surface of the semiconductor wafer. A number of etch pits are formed in the first surface of the semiconductor wafer at selected locations in the functional circuit An anodic etch of the semiconductor wafer is performed such that high aspect ratio holes are formed through the semiconductor wafer from the first surface to a second, opposite surface. A cladding layer of an optical fiber is formed on an inner surface of the high aspect ratio holes. A core layer of the optical fiber is also formed. The optical fiber is selectively coupled to the functional circuit.

In another embodiment, a method for forming an optical fiber through a semiconductor substrate is provided. The method includes forming at least one high aspect ratio hole through the semiconductor substrate that passes through the semiconductor substrate from a first working surface to a surface opposite the first working surface. A cladding layer of an optical fiber is formed on an inner surface of the at least one high aspect ratio hole. A core layer of the optical fiber is also formed. In one embodiment, the cladding layer comprises an oxide layer formed in the high aspect ratio holes. In another embodiment, the core layer comprises a layer of an oxide with an index of refraction that is greater than the index of refraction of the cladding layer. In another embodiment, the core layer comprises a layer with a hole that extends substantially along the length of the optical fiber with a diameter that is less than 0.59 times the wavelength of light used to transmit signals over the optical fiber.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Figure 1A:
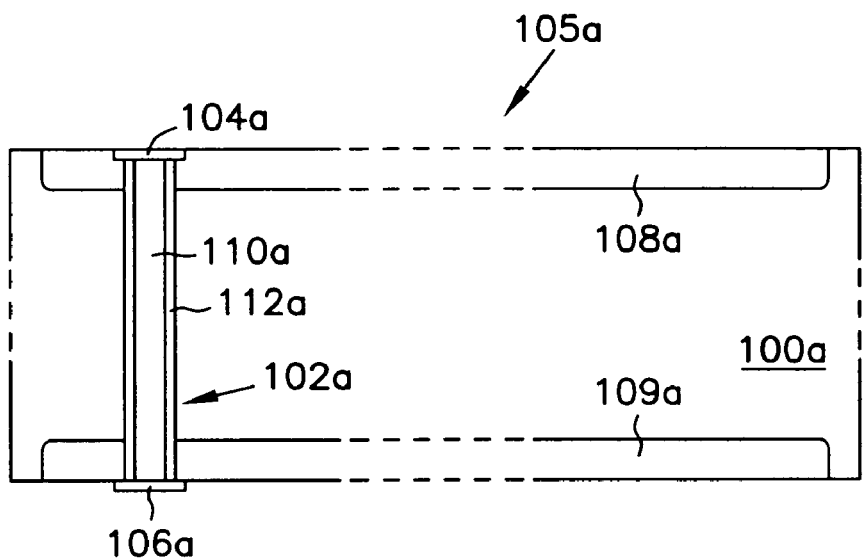
FIGS. 1A, 1B, and 1C are elevational views of exemplary embodiments of an integrated circuit with a semiconductor wafer having an optical fiber formed in an high aspect ratio hole that extends through the semiconductor wafer according to the teachings of the present invention.

FIG. 1A is an elevational view of an embodiment of the present invention. Electronic system 105a includes semiconductor wafer 100a. Semiconductor wafer 100a includes at least one optical fiber 102a that provides a path for transmitting signals between functional circuit 108a on a first surface of semiconductor wafer 100a and functional circuit 109a on a second, opposite surface of semiconductor wafer 100a. It is noted that a number of optical fibers can be formed through semiconductor wafer 100a.

Optical fiber 102a is formed in a high aspect ratio hole in semiconductor wafer 10a. The high aspect ratio hole is formed using, for example, an anodic etching technique as described in more detail below. Typically, the high aspect ratio holes have an aspect ratio in the range of approximately 100 to 200. Conventionally, a semiconductor wafer has a thickness in the range of approximately 100 to 1000 microns. Thus, the high aspect ratio holes used to form the optical fibers can be fabricated with a width that is in the range from approximately 0.5 microns to approximately 10 microns.

Optical fiber 102a is coupled to functional circuits 108a and 109a. For example, optical transmitter 104a is coupled to one end of optical fiber 102a and optical receiver 106a is coupled to a second, opposite end of optical fiber 102a. Optical transmitter 104a is also coupled to a node of functional circuit 108a and optical receiver 106a is coupled to a node of functional circuit 109a. In one embodiment, optical transmitter 104a comprises a gallium arsenide transmitter that is bonded to the first surface of semiconductor wafer 100a using conventional wafer bonding techniques. In this embodiment, optical receiver 106a comprises a silicon photodiode detector formed in the second surface of semiconductor wafer 100a. In other embodiments, other appropriate optical receivers and transmitters may be used to transmit signals over optical fiber 102a.

Figure 6:
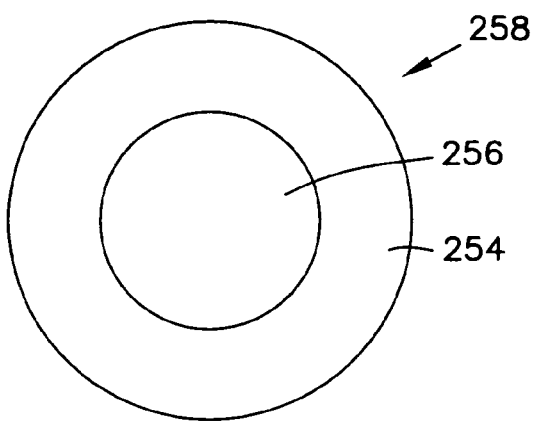

Optical fiber 102a comprises cladding layer 112a that separates core 110a from semiconductor wafer 100a. In this structure, semiconductor wafer 100a acts as the outer "sheath" for optical fiber 102a. Various materials can be used to form core 110a and cladding layer 112a. Basically, core 110a comprise a material with a higher index of refraction than the material of cladding layer 112a and thus provides normal optical fiber waveguide characteristics. Specific examples of materials for core 110a and cladding layer 112a are provided below with respect to FIGS. 6 and 7.

Since the optical fiber is formed in a wafer of semiconductor material, absorption by and radiation in the semiconductor wafer can affect the operation of the optical fiber. For example, if the wavelength of the light transmitted in optical fiber 102a is greater than the absorption edge of the semiconductor wafer, e.g., 1.1 microns for silicon, then semiconductor wafer 100a will not absorb the light transmitted in optical fiber 102a. However, due to the large change in index of refraction at the interface between cladding layer 112a and semiconductor wafer 100a, some radiation loss occurs into semiconductor wafer 100a. This case is depicted, for example, in FIG. 8.

Figure 8:
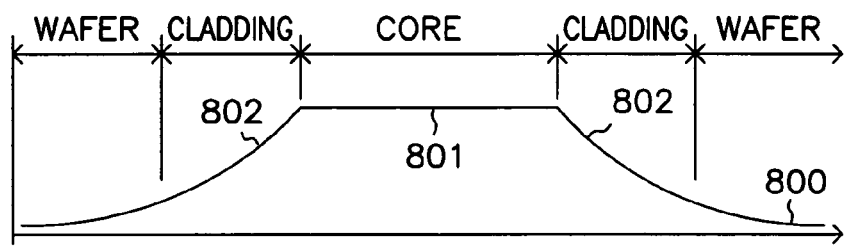
FIGS. 8 and 9 are graphs that show guided waves in optical fibers according to the teachings of the present invention.

FIG. 8 is a graph that illustrates the magnitude of the radiation in optical fiber 102a along a diameter of optical fiber 102a. In the region of core 256, indicated at 801, optical waves are guided with no substantial loss along the length of optical fiber 102a. Evanescent fields are present in the region of cladding layer 254 as indicated at 802. These evanescent fields drop off to insignificant levels as indicated at 800 in the surrounding semiconductor wafer.

In the case of shorter wavelength light transmitted in optical fiber 102a, there will be some absorption as well as radiation into the semiconductor substrate. For example, with a silicon wafer, light with a wavelength of less than 1.1 microns produces some small losses due to absorption and radiation into the silicon wafer.

In some cases, it is advantageous to limit the penetration of the optical wave into semiconductor wafer 100a. This avoids problems related to possible photoregeneration of carriers in the surrounding semiconductor wafer 100a that might interfere with the normal operation of other integrated circuitry. To prevent optical waves from penetrating the semiconductor wafer, the hole that houses the optical fiber can be lined with a reflecting metal mirror prior to forming the cladding layer. A technique for forming the metal layer is described in related U.S. Pat. No. 6,090,636, which application is incorporated by reference.

Optical fibers can be added to circuits using a conventional layout for the circuit without adversely affecting the surface area requirements of the circuit. Conventional circuits typically include pads formed on the top surface of the semiconductor wafer that are used to connect to leads of the integrated circuit through bonding wires. Advantageously, the bonding wires of conventional circuits can be replaced by optical fibers 102a to allow signals to be passed between various integrated circuits of electronic system 105a without the need to attach the individual integrated circuits to a printed circuit board. This allows a substantial space savings in the design of electrical systems along with overcoming concerns related to signal loss or dissipation and interference with and by other integrated circuitry devices in the electrical system.

Figure 1B:
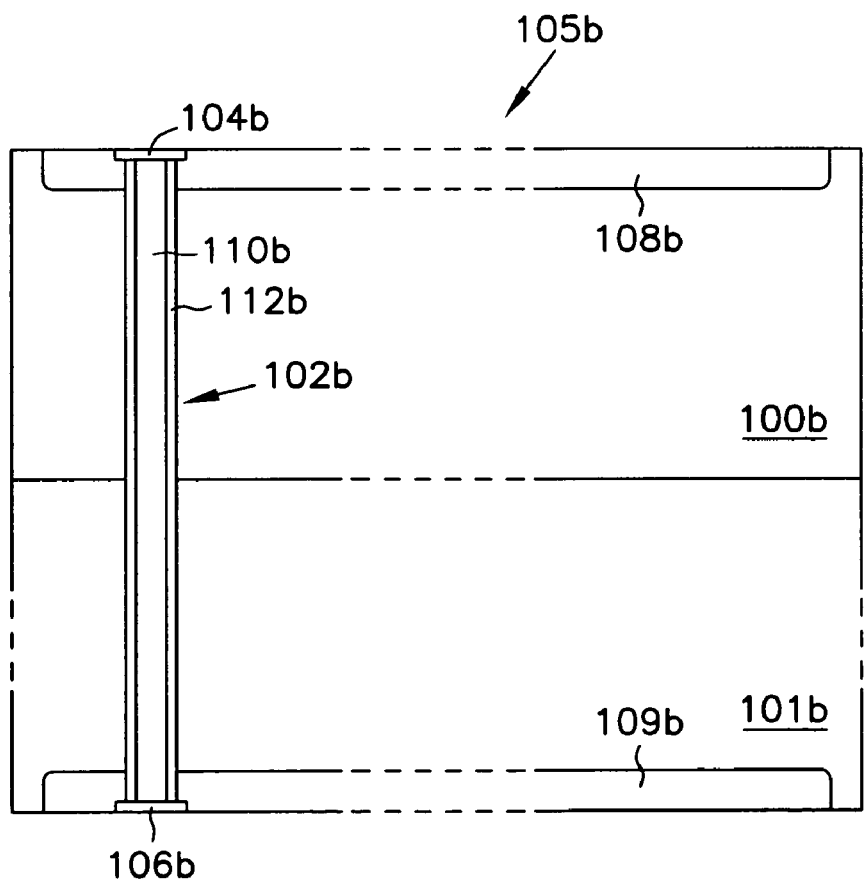
Figure 1C:
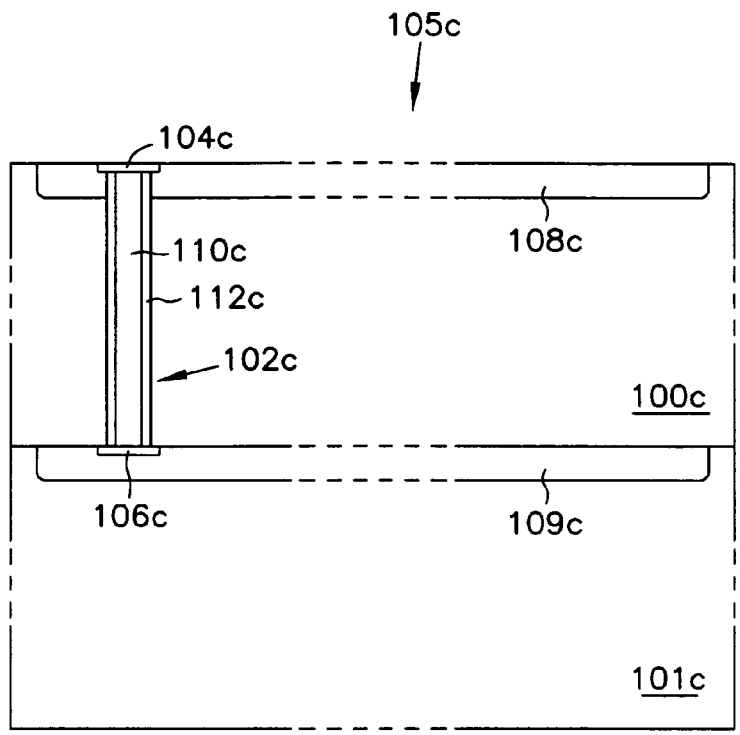

FIGS. 1B and 1C show additional embodiments of electronic systems using optical fibers formed through integrated circuits to interconnect various integrated circuits. In the embodiment of FIG. 1B, integrated circuits 108b and 109b are formed in working surfaces of semiconductor wafers 100b and 101b. Surfaces opposite the working surfaces of semiconductor wafers 100b and 101b are bonded together using conventional wafer bonding techniques. Optical fiber 102b transmits signals between integrated circuits 108b and 109b. A portion of optical fiber 102b is formed in each of the semiconductor wafers 100b and 101b. In the embodiment of FIG. 1C, semiconductor wafers 100c and 101c are stacked with the working surface of semiconductor wafer 101c beneath the surface of semiconductor wafer 100c that is opposite the working surface of semiconductor wafer 100c. In this embodiment, optical fiber 102c is formed within semiconductor wafer 100c.

FIGS. 2, 3, 4, 5, 6, and 7 are views of semiconductor wafer 200 at various points of an illustrative embodiment of a method for forming optical fibers through a semiconductor wafer according to the teachings of the present invention. Functional circuit 202 is formed in an active region of semiconductor wafer 200. For purposes of clarity, the Figures only show the formation of two optical fibers through semiconductor wafer 200. However, it is understood that with a particular functional circuit any appropriate number of optical fibers can be formed. Essentially, the optical fibers are formed in the same space on the surface of semiconductor wafer 200 that is conventionally used to form bonding pads for leads. In a conventional circuit, the leads of the integrated circuit are connected to a printed circuit board which routes signals to other integrated circuits. The optical fibers advantageously remove the need for a printed circuit board to interconnect the functional circuits formed on individual semiconductor wafers.

Figure 2:
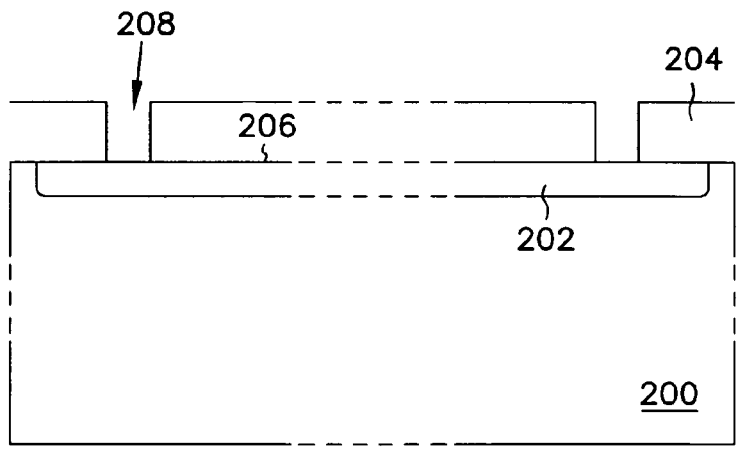
FIGS. 2, 3, 4, 5, 6, and 7 are views of a semiconductor wafer at various points of an illustrative embodiment of a method for forming an integrated circuit with optical fibers formed through at least one semiconductor wafer according to the teachings of the present invention.

As shown in FIG. 2, photo resist layer 204 is formed on surface 206 of semiconductor substrate 200. Photo resist layer 204 is patterned to provide openings 208 at points on surface 206 where high aspect ratio holes are to be formed through semiconductor wafer 200.

Figure 3:
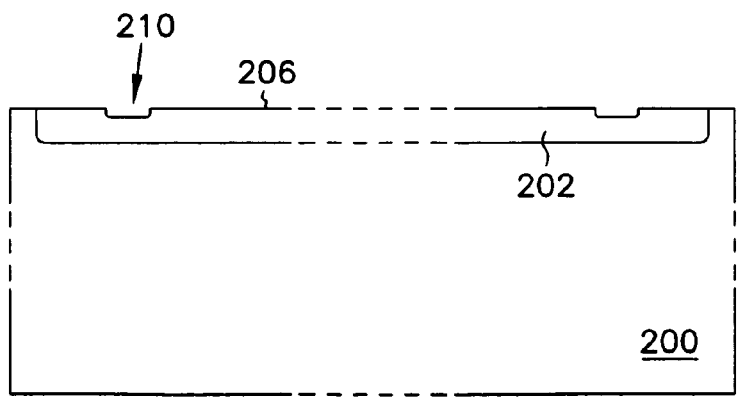

As shown in FIG. 3, etch pits 210 are formed by standard alkaline etching through openings 208 in photo resist layer 204. Photo resist layer 204 is then removed.

Figure 4:
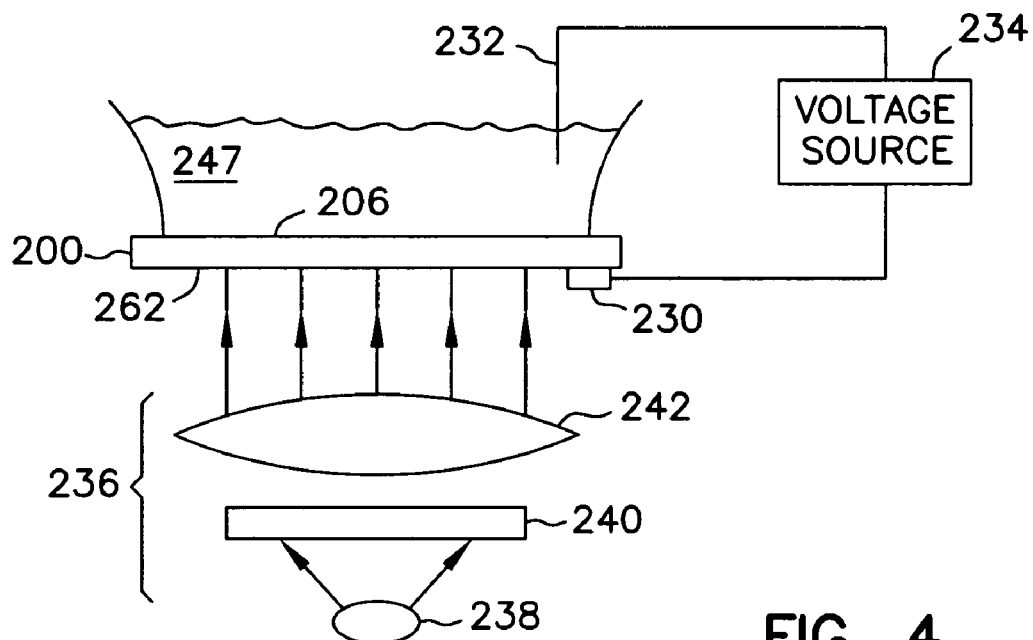
Figure 5:
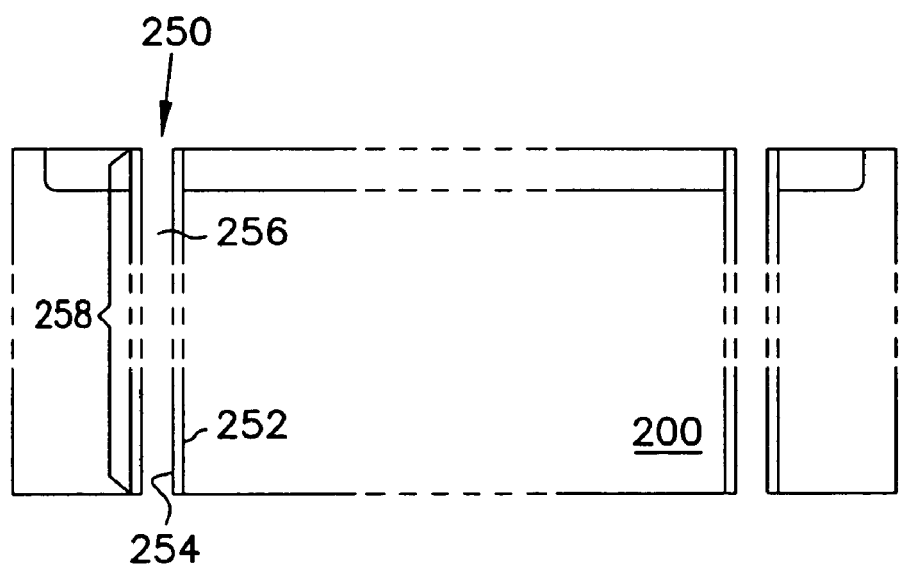

FIG. 4 is a schematic diagram that illustrates an embodiment of a layout of equipment used to carry out an anodic etch that is used to form high aspect ratio holes 250 of FIG. 5. Typically, holes 250 have an aspect ratio in the range of 100 to 200. Bottom surface 262 of semiconductor wafer 200 is coupled to voltage source 234 by positive electrode 230. Further, negative electrode 232 is coupled to voltage source 234 and is placed in a bath of 6% aqueous solution of hydrofluoric acid (HF) on surface 206 of semiconductor wafer 200.

In this example, illumination equipment 236 is also included because semiconductor wafer 200 is n-type semiconductor material. When p-type semiconductor material is used, the illumination equipment is not required. Illumination equipment 236 assures that there is a sufficient concentration of holes in semiconductor wafer 200 as required by the anodic etching process. Illumination equipment 236 includes lamp 238, IR filter 240, and lens 242. Illumination equipment 236 focuses light on surface 262 of semiconductor wafer 200.

In operation, the anodic etch etches high aspect ratio holes through semiconductor wafer 200 at the location of etch pits 210. Voltage source 234 is turned on and provides a voltage across positive and negative electrodes 230 and 232. Etching current flows from surface 206 to positive electrode 230. This current forms the high aspect ratio holes through semiconductor wafer 200. Further, illumination equipment illuminates surface 262 of semiconductor wafer 200 so as to assure a sufficient concentration of holes for the anodic etching process. The size and shape of the high aspect ratio holes through semiconductor wafer 200 depends on, for example, the anodization parameters such as HF concentration, current density, and light illumination. An anodic etching process is described in V. Lehmann, *The Physics of Macropore Formation in Low Doped n-Type Silicon*, J. Electrochem. Soc., Vol. 140, No. 10, pp. 2836–2843, October 1993, which is incorporated herein by reference.

As shown in FIG. 5, cladding layer 254 is formed on surface 252 of high aspect ratio holes 250. Further, core 256 is formed within hole 250 such that cladding layer 254 and core 256 comprise optical fiber 258.

Core 256 has an index of refraction that is greater than the index of refraction of cladding layer 254. Cladding layer 254 may comprise, for example, a transparent dielectric film such as silicon oxide ($SiO_2$), aluminum oxide ($Al_2O_3$), a nitride, other oxide, or other appropriate dielectric material. Cladding layer 254 is deposited with a uniformity that allows light to be transmitted through optical fiber 258 with normal optical fiber waveguide characteristics. When a nitride is used, cladding layer 254 can be deposited with the required uniformity using the technique described in K. P. Muller, et al, *Trench Node Technology for Gigabit DRAM Generations*, 1996 IEDM Technical Digest, p. 507–510 which is incorporated by reference. This technique allows nitride films to be deposited at low temperatures and low deposition rates to insure uniform coverage of very deep trenches. A technique referred to as "atomic layer epitaxy" can also be used to deposit cladding layer 254. Atomic layer epitaxy has been described for use with the deposition of silicon oxide ($SiO_2$), See J. W. Klaus, et al, *Atomic Layer Controlled Growth of $SiO_2$ Films Using Binary Reaction Sequence Chemistry*, Appl. Phys. Lett. 70(9), 3 Mar. 1997, pp. 1092–1094, which is incorporated by reference. Further, atomic layer epitaxy has been described for use with deposition of aluminum oxide ($Al_2O_3$). The atomic layer epitaxy technique deposits material with a thickness of 1 to 2 angstroms for a single binary reaction sequence. Thus, the technique advantageously allows the high aspect ratio holes that house the optical fibers to be lined with a uniform cladding layer.

In one embodiment, optical fiber 258 transmits light with a wavelength that is greater than 1.1 microns. In this embodiment, cladding layer 254 comprises silicon oxide ($SiO_2$) with an index of refraction of approximately 1.5 or aluminum oxide ($Al_2O_3$) with an index of refraction of approximately 1.7. Core 256 comprises lightly doped polysilicon. The lightly doped polysilicon has an index of refraction of approximately 3.4 and exhibits low optical absorption at wavelengths of greater than 1.1 microns. Optical fiber 258 of this embodiment is shown in cross section in FIG. 6.

Figure 7:
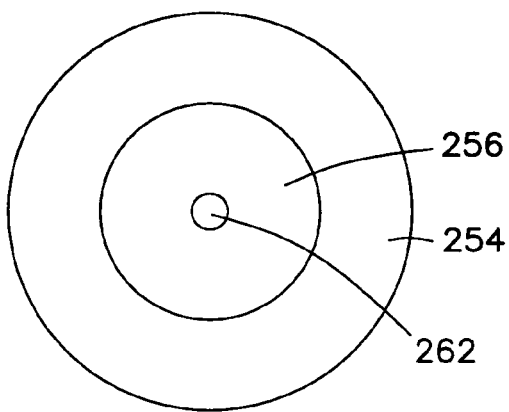
Figure 9:
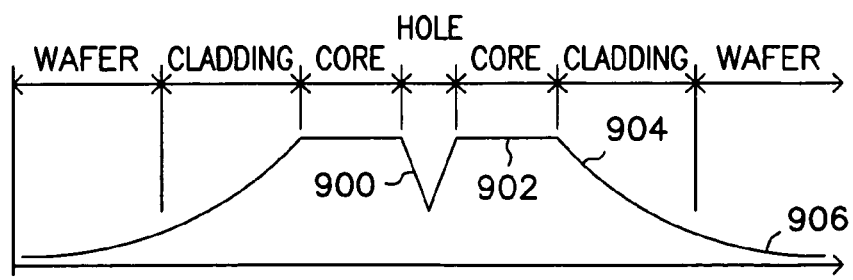

In another embodiment, cladding layer 254 comprises silicon oxide ($SiO_2$) and core 256 comprises an oxide or nitride with a higher index of refraction, e.g., aluminum oxide ($Al_2O_3$). A cross section of optical fiber 258 of this embodiment is shown in FIG. 7. Core 256 does not completely fill the center of optical fiber 258. Hole 262 extends along the length of core 256 through semiconductor wafer 200. However, as long as hole 262 has a diameter that is less than 0.59 times the wavelength of the light transmitted over optical fiber 258, the light will still be guided by core 256 as shown in FIG. 9. This embodiment can transport light with a wavelength that is less than 1.1 microns. This allows a gallium arsenide emitter to be used at one end of optical fiber 258 to transmit signals down optical fiber 258 and a simple silicon photodiode detector to be used as the receiver on the opposite end of optical fiber 258.

FIG. 9 is a graph that illustrates the magnitude of the radiation in an optical fiber of the type shown in FIG. 7 along a diameter of the optical fiber. In the region of hole 262, an evanescent field is present as indicated at 900. In the region of core 256, radiation in the optical fiber is guided along the length of the fiber without significant loss in intensity. Evanescent fields are present in the region of cladding layer 254 as indicated at 904. These evanescent fields drop off to insignificant levels as indicated at 906 in the surrounding semiconductor wafer.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, other materials such as oxides, nitrides, or high index glasses can be used to form the cladding layer and the core of an optical fiber that extends through a semiconductor wafer. It is noted that optical fibers 102 and 258 can transmit signals in either direction through the semiconductor wafer by proper placement of transmitters and receivers. Further, electronic systems can include more than two semiconductor wafers with sufficient optical fibers formed through the semiconductor wafers to allow signals to be communicated between the integrated circuits of the various semiconductor wafers.

Advantageously, using optical fibers according to the teachings of the present invention allows electronic systems to be constructed in less physical space compared to conventional electronic systems by removing the need for large printed circuit boards to interconnect various integrated circuits. This also provides the advantage of reducing the cost of packaging integrated circuits for a particular electronic system by allowing a number of circuits to be packaged together. Further, using the optical fibers assures the electrical integrity of interconnections between integrated circuits by reducing the physical length of electrical interconnections between devices. This reduces concerns with signal loss or dissipation and interference with and by other integrated circuitry devices.

What is claimed is:

1. An electronic system, comprising:
   a semiconductor substrate having a first surface, a second surface opposite the first surface, and a hole extending through the semiconductor substrate and connecting the first surface and the second surface;
   a first functional circuit on the first surface of the semiconductor substrate;
   an optical fiber in the hole, the optical fiber having a cladding layer and a core, the core including a core hole extending along a length of the core, the optical fiber also having a first end and a second end;
   an optical transmitter located at the first end of the optical fiber; and
   an optical receiver located at the second end of the optical fiber, wherein the optical transmitter and the optical receiver are configured to transmit optical signals through the semiconductor substrate between the first functional circuit and a second functional circuit.

2. The electronic system of claim 1, wherein the optical transmitter and the optical receiver are configured to transmit the optical signals from the first functional circuit to the second functional circuit.

3. The electronic system of claim 1, wherein the optical transmitter and the optical receiver are configured to transmit the optical signals from the second functional circuit to the first functional circuit.

4. The electronic system of claim 1, wherein the cladding layer surrounds the core, and a first index of refraction of the core is greater than a second index of refraction of the cladding layer.

5. An electronic system, comprising:
   a semiconductor substrate having a first surface, a second surface opposite the first surface, and a hole extending through the semiconductor substrate and connecting the first surface and the second surface;
   a first functional circuit on the first surface of the semiconductor substrate;
   an optical fiber in the hole, the optical fiber having a cladding layer and a core, the optical fiber also having a first end and a second end;
   an optical transmitter located at the first end of the optical fiber; and
   an optical receiver located at the second end of the optical fiber, wherein the optical transmitter and the optical receiver are configured to transmit optical signals through the semiconductor substrate between the first functional circuit and a second functional circuit, wherein the core of the optical fiber includes a core hole, the core hole running along the center of the optical fiber.

6. An electronic system, comprising:
   a semiconductor substrate having a first surface, a second surface opposite the first surface, and a hole extending through the semiconductor substrate and connecting the first surface and the second surface;

a first functional circuit on the first surface of the semiconductor substrate;
an optical fiber in the hole, the optical fiber having a cladding layer and a core, the optical fiber also having a first end and a second end;
an optical transmitter located at the first end of the optical fiber; and
an optical receiver located at the second end of the optical fiber, wherein the optical transmitter and the optical receiver are configured to transmit optical signals through the semiconductor substrate between the first functional circuit and a second functional circuit, further comprising a reflecting mirror lining the hole.

7. The electronic system of claim 1, wherein the cladding layer includes oxide material.

8. The electronic system of claim 1, wherein the cladding layer includes nitride material.

9. An electronic system, comprising:
a semiconductor substrate having a first surface, a second surface opposite the first surface, and a hole extending through the semiconductor substrate and connecting the first surface and the second surface;
a first functional circuit on the first surface;
a second functional circuit on the second surface;
an optical fiber in the hole, the optical fiber having a cladding layer and a core, the core including a core hole extending along a length of the core, the optical fiber also having a first end and a second end;
an optical transmitter located at the first end of the optical fiber; and
an optical receiver located at the second end of the optical fiber, wherein the optical transmitter and the optical receiver are configured to transmit optical signals through the semiconductor substrate between the first functional circuit and the second functional circuit.

10. The electronic system of claim 9, wherein the cladding layer includes $SiO_2$.

11. The electronic system of claim 9, wherein the cladding layer includes $Al_2O_3$.

12. The electronic system of claim 9, wherein the optical fiber is configured to transmit light having a wavelength, and wherein the hole includes a diameter of 0.59 times the wavelength of the light.

13. The electronic system of claim 9, wherein the optical transmitter includes gallium arsenide.

14. The electronic system of claim 9, wherein the optical receiver includes a silicon photodiode detector.

15. An electronic system, comprising:
a semiconductor substrate having a first surface, a second surface opposite the first surface, and a hole extending through the semiconductor substrate and connecting the first surface and the second surface;
a first functional circuit on the first surface;
a second functional circuit on the second surface;
an optical fiber in the hole, the optical fiber having a cladding layer and a core, the optical fiber also having a first end and a second end;
an optical transmitter located at the first end of the optical fiber; and
an optical receiver located at the second end of the optical fiber, wherein the optical transmitter and the optical receiver are configured to transmit optical signals through the semiconductor substrate between the first functional circuit and the second functional circuit, further comprising a reflecting mirror lining the hole.

16. An electronic system, comprising:
a semiconductor substrate having a first surface, a second surface opposite the first surface, and a hole extending through the semiconductor substrate and connecting the first surface and the second surface;
a memory device on the first surface;
a processor on the second surface;
an optical fiber in the hole, the optical fiber having a cladding layer and a core, the optical fiber also having a first end and a second end;
an optical transmitter located at the first end of the optical fiber; and
an optical receiver located at the second end of the optical fiber, wherein the optical transmitter and the optical receiver are configured to transmit optical signals through the semiconductor substrate between the memory device and the processor.

17. The electronic system of claim 16, wherein the cladding layer includes $SiO_2$.

18. The electronic system of claim 16, wherein the cladding layer includes $Al_2O_3$.

19. The electronic system of claim 16, wherein the optical fiber is configured to transmit light having a wavelength, and wherein the hole includes a diameter of 0.59 times the wavelength of the light.

20. The electronic system of claim 16, wherein the optical transmitter includes gallium arsenide.

21. The electronic system of claim 16, wherein the optical receiver includes a silicon photodiode detector.

22. The electronic system of claim 16, further comprising a reflecting mirror lining the hole.

23. An electronic system, comprising:
a first semiconductor substrate having a first surface, a second surface opposite the first surface, and a hole extending through the semiconductor substrate and connecting the first surface and the second surface;
a second semiconductor substrate bonded to the first semiconductor substrate, the second semiconductor substrate having a first surface and a second surface opposite the first surface;
a first functional circuit on the first surface of the first semiconductor substrate;
a second functional circuit on the first surface of the second semiconductor substrate;
an optical fiber in the hole, the optical fiber having a cladding layer and a core, the core including a core hole extending along a length of the core, the optical fiber also having a first end and a second end;
an optical transmitter located at the first end of the optical fiber; and
an optical receiver located at the second end of the optical fiber, wherein the optical transmitter and the optical receiver are configured to transmit optical signals through the first semiconductor substrate between the first functional circuit and the second functional circuit.

24. The electronic system of claim 23, wherein the cladding layer includes oxide material.

25. The electronic system of claim 23, wherein the cladding layer includes nitride material.

26. The electronic system of claim 23, wherein the cladding layer surrounds the core, and a first index of refraction of the core is greater than a second index of refraction of the cladding layer.

27. The electronic system of claim 23, wherein the core of the optical fiber includes a core hole, the core hole running along the center of the optical fiber.

28. The electronic system of claim 23, further comprising a reflecting mirror lining the hole.

29. The electronic system of claim 23, wherein the optical fiber is configured to transmit light with a wavelength greater than 1.1 microns.

30. An electronic system, comprising:
a first semiconductor substrate having a first surface, a second surface opposite the first surface, and a first hole extending through the first semiconductor substrate and connecting the first surface and the second surface;
a second semiconductor having a first surface and a second surface opposite the first surface, and a second hole extending through the first semiconductor substrate and connecting the first surface and the second surface, wherein the second surface of the first semiconductor substrate is bonded to the second surface of the second semiconductor substrate;
a first functional circuit on the first surface of the first semiconductor substrate;
a second functional circuit on the first surface of the second semiconductor substrate;
an optical fiber in the first hole and the second hole, the optical fiber having a cladding layer and a core, the core including a core hole extending along a length of the core, the optical fiber also having a first end and a second end;
an optical transmitter located at the first end of the optical fiber; and
an optical receiver located at the second end of the optical fiber, wherein the optical transmitter and the optical receiver are configured to transmit optical signals through the first semiconductor substrate and the second semiconductor substrate between the first functional circuit and the second functional circuit.

31. The electronic system of claim 30, wherein the cladding layer includes $SiO_2$.

32. The electronic system of claim 31, wherein the core includes doped polysilicon.

33. The electronic system of claim 32, further comprising a reflecting mirror lining at least one of the first and the second hole.

34. The electronic system of claim 31, wherein the core includes $Al_2O_3$.

35. The electronic system of claim 30, further comprising a reflecting mirror lining the hole.

36. An electronic system, comprising:
a first semiconductor substrate having a first surface, a second surface opposite the first surface, and a hole extending through the semiconductor substrate and connecting the first surface and the second surface;
a second semiconductor substrate having a first surface and a second surface opposite the first surface, wherein the second surface of the first semiconductor substrate is bonded to the first surface of the second semiconductor substrate;
a first functional circuit on the first surface of the first semiconductor substrate;
a second functional circuit on the first surface of the second semiconductor substrate;
an optical fiber in the hole, the optical fiber having a cladding layer and a core, the core including a core hole extending along a length of the core, the optical fiber also having a first end and a second end;
an optical transmitter located at the first end of the optical fiber; and
an optical receiver located at the second end of the optical fiber, wherein the optical transmitter and the optical receiver are configured to transmit optical signals through the first semiconductor substrate between the first functional circuit and second functional circuit.

37. The electronic system of claim 36, wherein the cladding layer includes $Al_2O_3$.

38. The electronic system of claim 37, wherein the core includes doped polysilicon.

39. The electronic system of claim 38, further comprising a reflecting mirror lining the hole.

40. The electronic system of claim 36, wherein the cladding layer includes $SiO_2$ and the core includes $Al_2O_3$.

41. An electronic system, comprising:
a first semiconductor substrate having a first surface, a second surface opposite the first surface, and a hole extending through the semiconductor substrate and connecting the first surface and the second surface;
a second semiconductor substrate bonded to the first semiconductor substrate, the second semiconductor substrate having a first surface and a second surface opposite the first surface;
a memory device on the first surface of the first semiconductor substrate;
a processor on the first surface of the second semiconductor substrate;
an optical fiber in the hole, the optical fiber having a cladding layer and a core, the optical fiber also having a first end and a second end;
an optical transmitter located at the first end of the optical fiber; and
an optical receiver located at the second end of the optical fiber, wherein the optical transmitter and the optical receiver are configured to transmit optical signals through the first semiconductor substrate between the memory device and the processor.

42. The electronic system of claim 41, wherein the cladding layer includes oxide material.

43. The electronic system of claim 41, wherein the cladding layer includes nitride material.

44. The electronic system of claim 41, wherein the cladding layer surrounds the core, and a first index of refraction of the core is greater than a second index of refraction of the cladding layer.

45. The electronic system of claim 41, wherein the core of the optical fiber includes a core hole, the core hole running along the center of the optical fiber.

46. The electronic system of claim 41, further comprising a reflecting mirror lining the hole.

47. The electronic system of claim 41, wherein the optical fiber is configured to transmit light with a wavelength greater than 1.1 microns.

* * * * *

UNITED STATES PATENT AND TRADEMARK OFFICE
CERTIFICATE OF CORRECTION

PATENT NO.      : 6,995,443 B2
DATED           : February 7, 2006
INVENTOR(S)     : Geusic et al.

It is certified that error appears in the above-identified patent and that said Letters Patent is hereby corrected as shown below:

<u>Title page,</u>
Item [56], References Cited, FOREIGN PATENT DOCUMENTS,
after "5/1981" insert -- H01L 23/52 --;
after "1/1991" insert -- G02B 6/12 --;
after "9/1992" insert -- H01L 25/04 --;
after "6/1993" insert -- H01L 29/44 --;
after "8/1991" insert -- H01R 9/00 --;
after "3/1994" insert -- H01L 23/48 --.
OTHER PUBLICATIONS,
"Gong, S., et al." reference, delete "System" and insert -- Systems --;
"Horie, H., et al." reference, delete "Ration" and insert -- Ratio --;
"Lehmann, et al." reference, delete "et al." and insert -- et al., --;
"Lehmann, et al." reference (second occurrence), delete "et al.," and insert -- V., --;
delete "Electrochemcial" and insert -- Electrochemical --;
"Masu, K., et al." reference, delete "of" and insert -- on --;
"Ott, A W., et al." reference, delete "Al3O3" and insert -- $Al_3O_3$ -- and delete "vol." and insert -- Vol. --;
"Ramo, S., et al." reference, delete "Field" and insert -- Fields --;
"Su, O.K., et al." reference, delete "vol." and insert -- Vol. --;
"Sze, S. M." reference, delete "S.M.," and insert -- S M., --.

<u>Column 3,</u>
Line 18, delete "an" and insert -- a --.
Line 56, delete "horizonal" and insert -- horizontal --.

<u>Column 4,</u>
Line 5, delete "10a" and insert -- 100a --.

UNITED STATES PATENT AND TRADEMARK OFFICE
CERTIFICATE OF CORRECTION

PATENT NO. : 6,995,443 B2
DATED : February 7, 2006
INVENTOR(S) : Geusic et al.

It is certified that error appears in the above-identified patent and that said Letters Patent is hereby corrected as shown below:

Column 9,
Line 58, delete "haying" and insert -- having --.

Signed and Sealed this

Second Day of May, 2006

JON W. DUDAS
*Director of the United States Patent and Trademark Office*